(12) United States Patent
Lange et al.

(10) Patent No.: US 10,249,455 B2
(45) Date of Patent: Apr. 2, 2019

(54) IN-WALL ELECTRICAL CONTROL UNIT WITH OPENABLE SWITCH COVER

(71) Applicant: Jasco Products Company LLC, Oklahoma City, OK (US)

(72) Inventors: Ryan Lange, Edmond, OK (US); Douglas Cameron Trice, Oklahoma City, OK (US)

(73) Assignee: JASCO PRODUCTS COMPANY LLC, Oklahoma City, OK (US)

( * ) Notice: Subject to any disclaimer, the term of this patent is extended or adjusted under 35 U.S.C. 154(b) by 0 days.

(21) Appl. No.: 15/882,737

(22) Filed: Jan. 29, 2018

(65) Prior Publication Data

US 2018/0218855 A1  Aug. 2, 2018

Related U.S. Application Data

(60) Provisional application No. 62/451,292, filed on Jan. 27, 2017.

(51) Int. Cl.

| *H01H 13/14* | (2006.01) |
|---|---|
| *H05K 5/00* | (2006.01) |
| *H05B 37/02* | (2006.01) |
| *H05K 5/02* | (2006.01) |
| *H01H 13/04* | (2006.01) |
| *H05K 5/03* | (2006.01) |
| *H02G 3/14* | (2006.01) |

(52) U.S. Cl.
CPC ............ *H01H 13/14* (2013.01); *H01H 13/04* (2013.01); *H02G 3/14* (2013.01); *H05B 37/0281* (2013.01); *H05K 5/0017* (2013.01); *H05K 5/0226* (2013.01); *H05K 5/03* (2013.01)

(58) Field of Classification Search
CPC ........ H05B 39/06; H05B 39/085; H01H 3/08; H01H 3/12; H01H 23/04; H01H 23/065; H01H 23/12
USPC .................. 315/131, 136; 200/237, 329, 341
See application file for complete search history.

(56) References Cited

U.S. PATENT DOCUMENTS

| 5,068,639 A * | 11/1991 | Swanson ................ H05B 39/00 |
|---|---|---|
| | | 200/252 |
| 7,414,210 B2 * | 8/2008 | Clegg .................... H01H 13/70 |
| | | 200/314 |
| 7,667,155 B1 * | 2/2010 | Ni ........................ H01H 23/145 |
| | | 200/331 |
| 9,401,252 B2 * | 7/2016 | Keirstead ............... H01H 23/04 |
| 2008/0136683 A1 * | 6/2008 | Swatsky ............ H05B 37/0272 |
| | | 341/23 |
| 2010/0127626 A1 * | 5/2010 | Altonen ............... H05B 39/085 |
| | | 315/129 |
| 2010/0214756 A1 * | 8/2010 | Feldstein ............. H01H 9/0271 |
| | | 361/807 |

(Continued)

*Primary Examiner* — Tung X Le

(57) ABSTRACT

An in-wall electrical control unit with openable switch cover has a switch cover attached to a housing of the electrical control unit adjacent to a user interface of the electrical control unit such that the switch cover can be maneuvered between an opened position exposing the user interface for programming and a closed position wherein the switch cover is positioned over the user interface. An interface actuation knob on an inner surface of the switch cover aligned with a specific control of the user interface allows the user to operate the specific control while the switch cover is in the closed position.

10 Claims, 5 Drawing Sheets

(56) References Cited

U.S. PATENT DOCUMENTS

2016/0113097 A1* 4/2016 King .................. H05B 37/0281
                                                    315/136

* cited by examiner

IN-WALL ELECTRICAL CONTROL UNIT WITH OPENABLE SWITCH COVER

The current application claims a priority to the U.S. Provisional Patent application Ser. No. 62/451,292 filed on Jan. 27, 2017. The current application is filed on Jan. 29, 2018, whereas Jan. 27, 2018 and Jan. 28, 2018 were on a weekend.

FIELD OF THE INVENTION

The present invention relates generally to electrical controls. More particularly, the present invention relates to an in-wall electrical control timer unit with an openable switch cover that cover the full user interface of the unit including any digital display when in the closed position.

BACKGROUND OF THE INVENTION

In the majority of modern homes, offices and other buildings, electrical power is used to operate various systems of the building such as lighting, heating, ventilation, and air circulation (HVAC), and supplying power to various electrical appliances. In particular, lighting in a home or office space is typically controlled through in-wall switches, timers, or other types of electrical control units.

Electrical control units such as lighting control units vary extensively in design, and different lighting control units may be chosen to be installed in various spaces based on combinations of factors such as budget, functionality, and aesthetics. Some may consider having exposed buttons, digital displays, or other features of an electrical control unit visible to be ugly or otherwise undesirable. It is therefore an object of the present invention to provide an electrical control unit with an openable switch cover in order to conceal the entirety of the main user interface of the unit while still providing a modicum of functionality. The user may use the switch cover to operate a specific control on the user interface while closed, and may open the switch cover in order to access the full controls of the unit if desired.

DETAIL DESCRIPTIONS OF THE INVENTION

Figure 1:
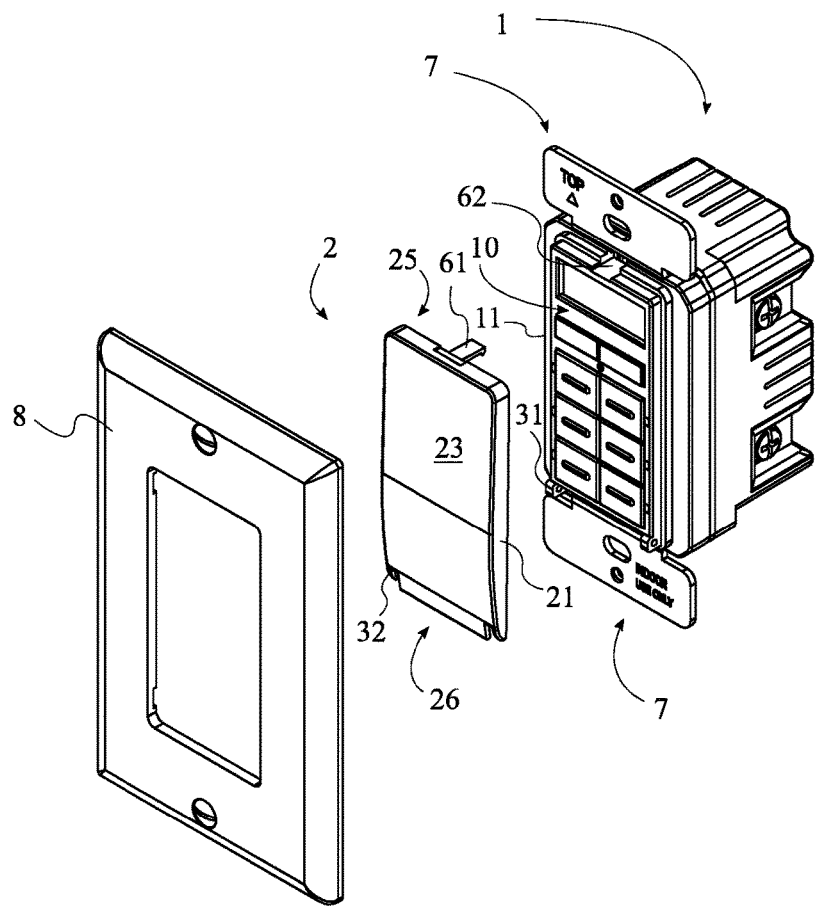
FIG. 1 is an exploded view of the present invention with the switch cover in the closed position.
Figure 2:
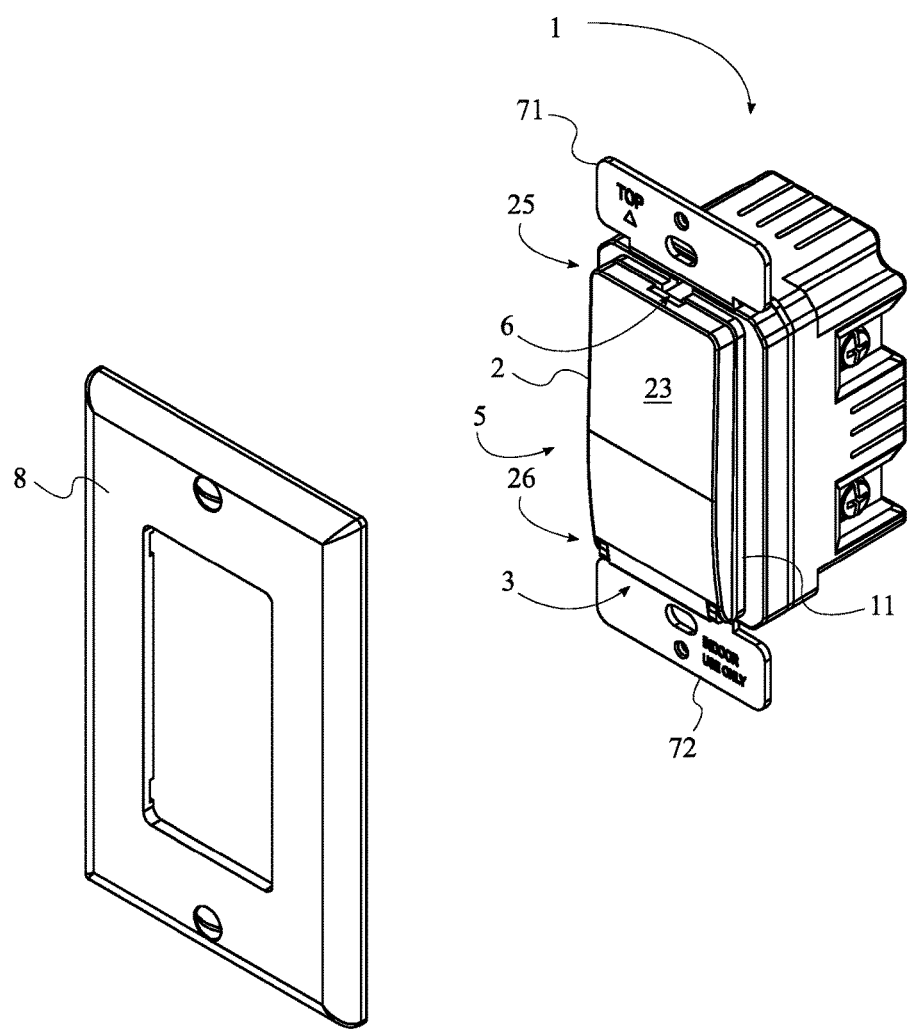
FIG. 2 is a partially exploded view of the present invention with the switch cover in the closed position.

All illustrations of the drawings are for the purpose of describing selected versions of the present invention and are not intended to limit the scope of the present invention. The present invention is to be described in detail and is provided in a manner that establishes a thorough understanding of the present invention. There may be aspects of the present invention that may be practiced or utilized without the implementation of some features as they are described. It should be understood that some details have not been described in detail in order to not unnecessarily obscure focus of the invention. References herein to "the preferred embodiment", "one embodiment", "some embodiments", or "alternative embodiments" should be considered to be illustrating aspects of the present invention that may potentially vary in some instances, and should not be considered to be limiting to the scope of the present invention as a whole.

The present invention is an electrical control unit with an openable switch cover. The present invention provides concealment of the full controls of the electrical control unit while maintaining a functional switch that may be used for a singular purpose such as, for example, an on/off switch. If the electrical control unit is a lighting control unit with timer functionality, for example, the user may press the switch cover while closed in order to simply turn a set of lights on or off, or the user may open the switch cover in order to access additional controls, such as adjusting timer settings for the set of lights.

Referring to FIGS. 1-5, in general, the present invention comprises an electrical control unit 1, a switch cover 2, and an attachment mechanism 3. It is contemplated that in various embodiments of the present invention, the electrical control unit 1 may vary in functionality. In some embodiments, the electrical control unit 1 may be a lighting control unit. In some embodiments, the electrical control unit 1 may be an HVAC control unit. In other embodiments, the electrical control unit 1 may be any other relevant electrical control unit 1. In some embodiments, the electrical control unit 1 may have timer functionality. For example, the user may interact with the user interface in order to set a preset timer for a specific set of lighting to remain activated, or to be activated and deactivated according to a pre-set or user defined schedule.

The electrical control unit 1 comprises a user interface 10 and a housing 11. The housing 11 is connected around the user interface 10 and serves as the main support structure for the electrical control unit 1. It is contemplated that the electrical control unit 1 and the housing 11 may be considered to be integrated into a singular component in various embodiments. The user interface 10 may vary in different embodiments of the present invention; however, it may be understood that the user interface 10 comprises one or more buttons, switches, display screens, lights, or other interactive elements or visual indicators required or desired for proper functionality and user control.

In various embodiments, the switch cover 2 may take various forms, providing that the primary functionality described hereinafter is provided. In general, in some embodiments, the switch cover 2 is a generally planar, elongated structure. The switch cover 2 may be manufactured from any desired material, including, but not limited to, plastic, metal, or any other desired materials. The switch cover 2 is engaged with the housing 11 through the attachment mechanism 3 adjacent to the user interface 10. Moreover, the switch cover 2 may be selectively positioned between an opened position 4 and a closed position 5 through the attachment mechanism 3, wherein the switch cover 2 is positioned adjacent to the user interface 10 in the closed position 5. More particularly, in the preferred embodiment, the switch cover occludes the user interface 10 from view in the closed position 5; thus, the user interface 10 is entirely covered by the switch cover 2 in the closed position 5. It is desired in the present invention to cover the entirely of the user interface 10 with the switch cover 2 in the closed position, including, but not limited to, all buttons, switched, and digital or analog displays of the user interface. Thus, the switch cover 2 may be used as a singular switch to operate one of the functions of the electrical control unit 1 by pressing on the switch cover 2 while the switch cover 2 is in the closed position 5, thereby pressing on one of the controls of the user interface 10. Furthermore, the switch cover 2 may be moved into the opened position 4 by the user in order to access the full controls and display(s) of the user interface 10.

More particularly, in some embodiments, the switch cover 2 comprises a body 21, an inner surface 22, an outer surface 23, and an interface actuation knob 24. The inner surface 22 and the outer surface 23 are positioned opposite each other across the body 21. The inner surface 22 is positioned adjacent to the user interface 10 in the closed position 5, and the outer surface 23 is exposed to viewing by the user. The interface actuation knob 24 is positioned on the inner surface 22 in such a manner as to be aligned with a specific control of the user interface 10. The specific positioning of the interface actuation knob 24 may vary according to the specific layout of the user interface 10 and the specific control desired to be actuated through pressing the switch cover 2. More particularly, in some embodiments, the user interface 10 comprises a specific control element 12, and the interface actuation knob 24 is aligned with the specific control element 12 when the switch cover 2 is in the closed position 5. Moreover, a specific region of the user interface 10 may be understood to correspond with the location of the specific control element 12. The interface actuation knob 24, therefore, is positioned in a corresponding region of the inner surface 22 such that the specific region of the user interface 10 and the corresponding region of the inner surface 22 are positioned adjacent to each other when the switch cover 2 is in the closed position 5, enabling the interface actuation knob 24 to come into contact with the specific control element 12 when the user presses on the switch cover 2.

Figure 3:
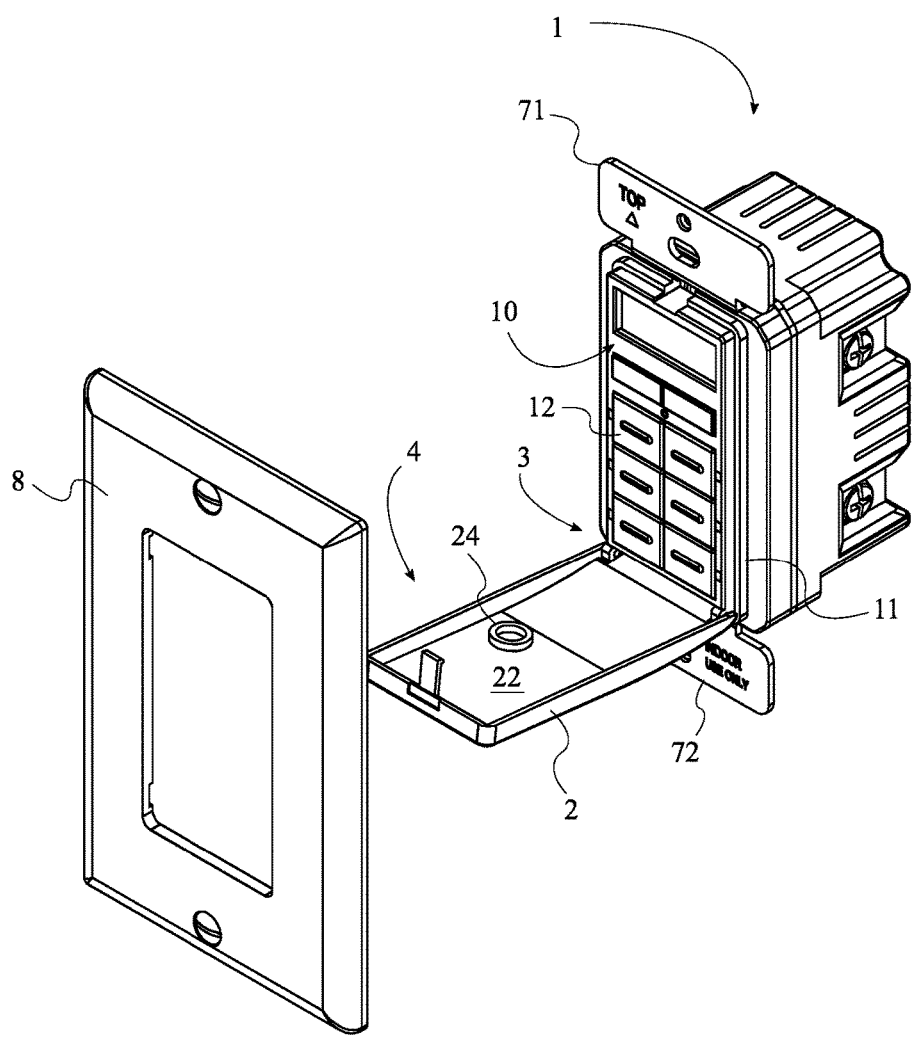
FIG. 3 is a partially exploded view of the present invention with the switch cover in the opened position.
Figure 4:
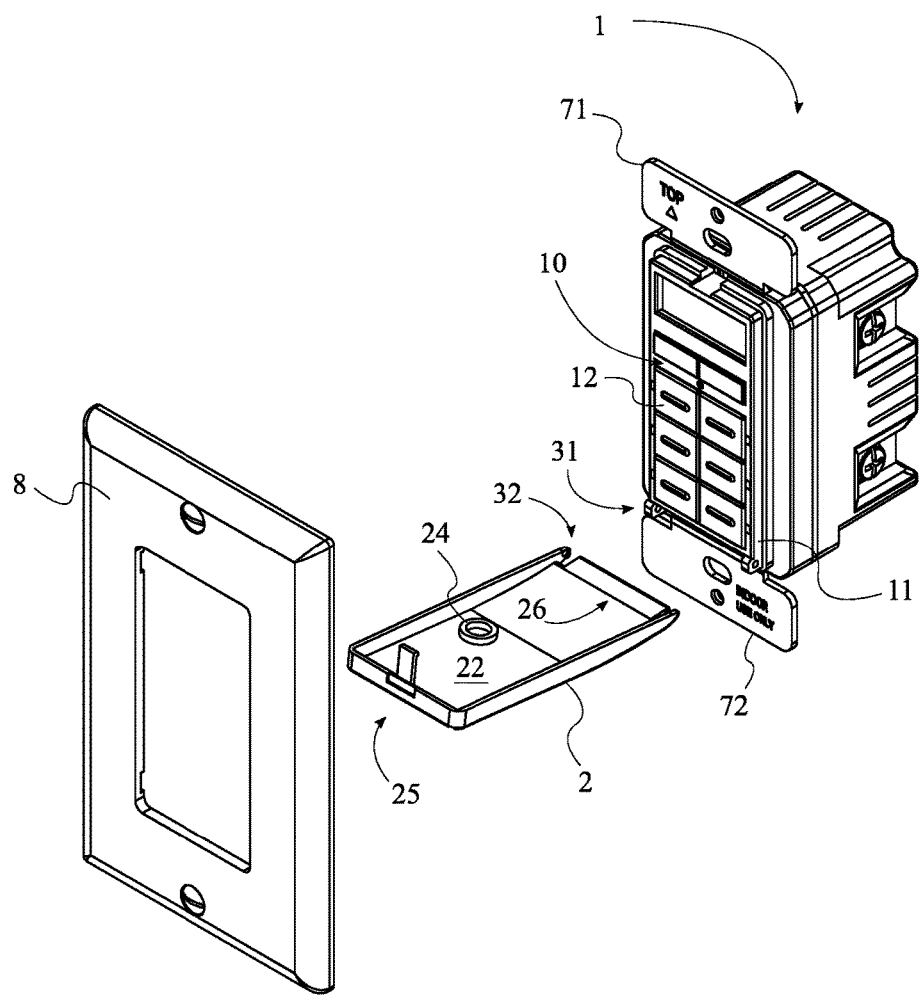
FIG. 4 is an exploded view of the present invention with the switch cover in the opened position.
Figure 5:
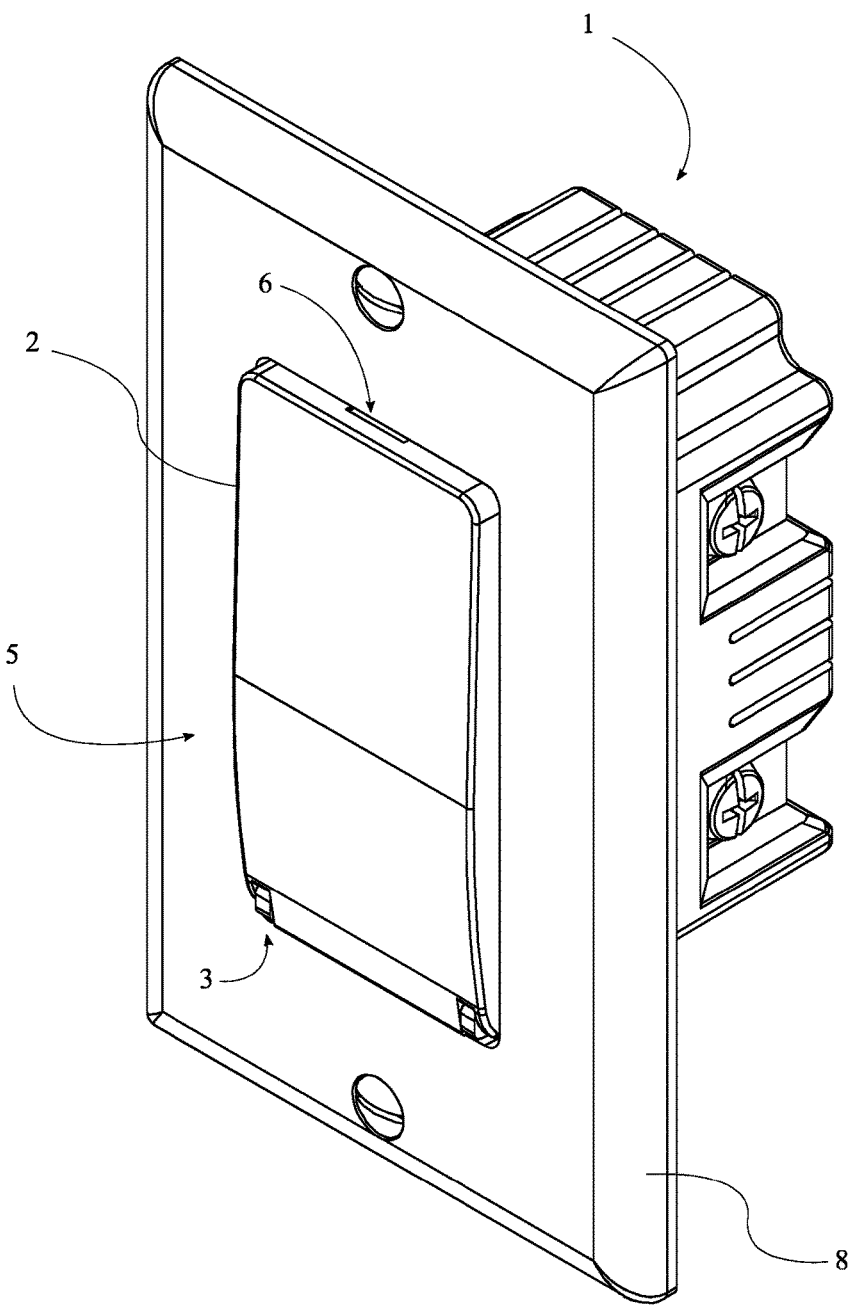
FIG. 5 is a perspective view of the present invention with the switch cover in the closed position.

It is contemplated that there may be various means of engaging the switch cover 2 onto the housing 11 in accordance with the purpose and spirit of the present invention. In some embodiments, the switch cover 2 may be engaged with the housing 11 through a sliding mechanism as the attachment mechanism 3. In some embodiments, the switch cover 2 may simply snap on to the housing 11 over the user interface 10. In various other embodiments, the switch cover 2 may be engaged with the housing 11 via any other means that enables the switch cover 2 to fulfill the intended purposes of: enabling the user to press on the switch cover 2 in order to actuate a specific control of the user interface 10, and enabling the user to manipulate the switch cover 2 in order to expose the full controls of the user interface 10. Preferably, the switch cover 2 is also completely removably and re-attachable, as illustrated in FIGS. 3-4. In the preferred embodiment however, the switch cover 2 is removably attached to the housing 11 through the attachment mechanism 3, the switch cover 2 is hingedly engaged with the housing 11, and the attachment mechanism 3 is a hinge joint.

More specifically, the attachment mechanism 3 comprises a first hinge portion 31 and a second hinge portion 32 forming a hinge joint. The first hinge portion 31 is connected to the housing 11, and the second hinge portion 32 is connected to the switch cover 2. The first hinge portion 31 is hingedly engaged with the second hinge portion 32, enabling the switch cover 2 to swing between the opened position 4 and closed position 5 through the hinge joint. In some embodiments, the hinge joint is configured to be a snap-fit joint such that the first hinge portion 31 may be disconnected from the second hinge portion 32 by applying outward force to the switch cover 2 away from the electrical control unit 1 in order to separate the switch cover 2 from the housing 11. The reverse process may be performed in order to attach the switch cover 2 to the housing 11 if separated.

Furthermore, the switch cover 2 comprises a first end 25 and a second end 26, with the body 21 extending between the first end 25 and the second end 26. The second end 26 is hingedly connected to the housing 11 through the second hinge joint.

The present invention preferably further comprises a fastening mechanism 6, and the switch cover 2 is selectively affixed in the closed position 5 covering the user interface 10 through the fastening mechanism 6. The fastening mechanism 6 may vary in different embodiments. In some embodiments, the fastening mechanism 6 is a cantilever snap-fit joint. In some embodiments, the fastening mechanism 6 may be an annular snap joint. In some embodiments, the fastening mechanism 6 may consist of hook and loop tape. In other embodiments, the fastening mechanism 6 may comprise any other means of removably affixing the switch cover 2 into the closed position 5.

Moreover, the fastening mechanism 6 comprises a first fastening portion 61 and a second fastening portion 62. In some embodiments, the first fastening portion 61 is connected to the first end 25 of the switch cover 2 adjacent to the inner surface 22, and the second fastening portion 62 is positioned on the housing 11 opposite the attachment mechanism 3. The first fastening portion 61 and the second fastening portion 62 are removably engaged with each other, enabling the user to disengage the fastening mechanism 6 from the closed position 5 and manipulate the switch cover 2 into the opened position 4 and vice versa.

In some embodiments, the switch cover 2 is engaged with the housing 11 such that from the opened position 4, the attachment mechanism 3 is located at the bottom of the switch cover 2 from the user's perspective. Thus, the switch cover 2 may be understood in some embodiments to rotate between a generally vertical orientation in the closed position 5, in a clockwise direction as seen from a left view of the present invention given that the user interface 10 is seen from a front view. In some embodiments, a stopper may be integrated into the housing 11 adjacent to the attachment mechanism 3 such that the switch cover 2 is prevented from rotating further than a specified angle from the closed position 5. For example, in the opened position 4 the switch cover 2 may be oriented approximately horizontal, 90 degrees from the closed position 5 from the user's perspective facing the present invention while installed in a wall, as shown in FIG. 3.

The present invention may further comprise at least one installation tab 7, with each of the at least one installation tab 7 being connected to the housing 11 opposite the lighting control unit. More specifically, the at least one installation tab 7 may comprise a first installation tab 71 and a second installation tab 72, each connected to the housing 11 and positioned opposite each other along the housing 11. In some embodiments, the first installation tab 71 and the second installation tab 72 are positioned vertically opposite each other from the user's perspective, as is common with in-wall lighting control units. Each of the installation tabs may comprise one or more holes for accommodating one or more screws, nails, bolts, or other types of fasteners for installation into a wall or other location. Finally, the present invention may further comprise a cover plate 8 as is typical with many types of in-wall electrical installations.

Although the invention has been explained in relation to its preferred embodiment, it is to be understood that many other possible modifications and variations can be made without departing from the spirit and scope of the invention as hereinafter claimed.

What is claimed is:

1. An in-wall electrical control unit with openable switch cover comprising:
   an electrical control unit;
   a switch cover;
   an attachment mechanism;
   the electrical control unit comprising a user interface and a housing;
   the housing being connected around the user interface;
   the switch cover being hingedly engaged with the housing through the attachment mechanism;
   the switch cover being selectively positioned in between an opened position and a closed position through the attachment mechanism;
   the switch cover being positioned adjacent to the user interface in response to the switch cover being positioned in the closed position;
   the switch cover comprising a body, an inner surface, an outer surface and an interface actuation knob;
   the inner surface being positioned opposite the outer surface across the body;
   the inner surface being positioned adjacent to the user interface in response to the switch cover being positioned in the closed position;
   the interface actuation knob being positioned on the inner surface without being positioned on the outer surface;
   the attachment mechanism comprising a first hinge portion and a second hinge portion;
   the first hinge portion being connected to the housing;
   the second hinge portion being connected to the switch cover;
   the first hinge portion and the second hinge portion being hingedly engaged with each other so as to form a hinge joint; and
   the switch cover being swingable in between the opened position and the closed position at the hinge joint by the first hinge portion and the second hinge portion being hingedly engaged with each other.

2. The in-wall electrical control unit with openable switch cover as claimed in claim 1, wherein the electrical control unit is a lighting control unit.

3. The in-wall electrical control unit with openable switch cover as claimed in claim 1, wherein the electrical control unit has timer functionality.

4. The in-wall electrical control unit with openable switch cover as claimed in claim 1, wherein the user interface is entirely covered by the switch cover when the switch cover is positioned in the closed position.

5. The in-wall electrical control unit with openable switch cover as claimed in claim 1 comprising:
   the user interface comprising a specific control element; and
   the interface actuation knob being aligned with the specific control element in response to the switch cover being positioned in the closed position.

6. The in-wall electrical control unit with openable switch cover as claimed in claim 1 comprising:
   the switch cover being removably attached to the housing through the attachment mechanism.

7. The in-wall electrical control unit with openable switch cover as claimed in claim 1 comprising:
   a fastening mechanism; and
   the switch cover being affixed to the housing through the fastening mechanism in response to the switch cover being positioned in the closed position.

8. The in-wall electrical control unit with openable switch cover as claimed in claim 7 comprising:
   the fastening mechanism being a cantilever snap-fit joint.

9. The in-wall electrical control unit with openable switch cover as claimed in claim 7 comprising:
   the fastening mechanism comprising a first fastening portion and a second fastening portion;
   the first fastening portion being connected to a first end of the switch cover adjacent to the inner surface;
   the second fastening portion being positioned on the housing opposite the attachment mechanism; and
   the first fastening portion and the second fastening portion being removably engaged with each other.

10. The in-wall electrical control unit with openable switch cover as claimed in claim 1 comprising:
    at least one installation tab; and
    each of the at least one installation tab being connected to the housing opposite the lighting control unit.

* * * * *